United States Patent [19]

Eaton

[11] 4,257,915

[45] Mar. 24, 1981

[54] PHOTOPOLYMER INITIATOR SYSTEM CONTAINING A SEMICONDUCTOR, A REDUCING AGENT AND AN OXIDIZING AGENT

[75] Inventor: David F. Eaton, Wilmington, Del.

[73] Assignee: E. I. Du Pont de Nemours and Company, Wilmington, Del.

[21] Appl. No.: 59,993

[22] Filed: Jul. 23, 1979

[51] Int. Cl.$^3$ .......................... G03C 1/68; B01J 31/02
[52] U.S. Cl. .................................. 252/428; 252/430; 430/281; 430/288; 430/916
[58] Field of Search ............... 430/915, 281, 288, 270, 430/916; 252/428, 430

[56] References Cited

U.S. PATENT DOCUMENTS

| | | | |
|---|---|---|---|
| 3,041,172 | 6/1962 | Evans et al. | 96/115 F |
| 3,147,119 | 9/1964 | Evans et al. | 96/115 |
| 3,152,903 | 10/1964 | Shepard et al. | 430/332 |
| 3,236,644 | 2/1966 | Gilakan et al. | 96/49 |
| 3,346,383 | 10/1967 | Baxendale et al. | 96/35.1 |
| 3,615,446 | 10/1971 | Wong | 96/35.1 |
| 3,804,623 | 4/1974 | French | 96/47 |

FOREIGN PATENT DOCUMENTS 847259 7/1970 Canada .

OTHER PUBLICATIONS

Japanese Abstract, Japanese Kokai No. 52-34714 Published 3/16/77.

*Primary Examiner*—Jack P. Brammer
*Attorney, Agent, or Firm*—James A. Costello

[57] ABSTRACT

A photopolymer initiator system comprising selected semiconductors, reducing agents and oxidizing agents, in combination, and their use in photopolymerization and cross-linking of ethylenically unsaturated monomers.

6 Claims, No Drawings

PHOTOPOLYMER INITIATOR SYSTEM CONTAINING A SEMICONDUCTOR, A REDUCING AGENT AND AN OXIDIZING AGENT

FIELD OF THE INVENTION

This invention relates to a photopolymer initiator system for polymerizing and cross-linking ethylenically unsaturated photomonomers and to use of the system to produce photoimages.

DESCRIPTION OF THE PRIOR ART

It is known to use semiconductors in combination with an oxidation-reduction system to produce images on a paper support; see U.S. Pat. No. 3,804,623 and Canadian Pat. No. 847,259. It is also known to employ a supported semiconductor/oxidation-reduction copy medium as a discrete layer in combination with a photopolymerizable image-sensitive overlay; see U.S. Pat. No. 3,615,446.

It is known to employ semiconductors as initiators in photopolymerizable compositions; see, for example, U.S. Pat. No. 3,147,119, U.S. Pat. No. 3,041,172, U.S. Pat. No. 3,346,383, U.S. Pat. No. 3,236,644, and Japanese No. 52-34714. Such semiconductor-initiated photopolymerizable compositions may contain any of a number of co-initiators, dyes, oxidizable organic compounds, terminal trihalogenated photosensitizers, heavy metal salts and the like.

The three-component photopolymer initiator of this invention is disclosed nowhere in the art, neither as part of an imaging system without photopolymer, nor as part of a photopolymer system. In fact, nothing in the art shows any appreciation of the advantages of fast and efficient photopolymerization and photocross-linking attainable by employing a semiconductor/oxidation-reduction system as initiator or initiator/imaging component.

SUMMARY OF THE INVENTION

This invention concerns a three-component initiator system for photopolymerizable ethylenically unsaturated monomers. The term photopolymerization is employed for simplicity, it being understood that the initiator of this invention is equally useful in photocross-linking applications.

The photoinitiator comprises, based on total weight of the photoinitiator:

(i) about 70 to 95 percent, of the combined weight of components (i) and (ii), of a wide-band n-type semiconductor characterized by (a) an energy gap greater than about 2.0 electron volts, and (b) a conduction band potential under flat band conditions more negative than zero volts versus the saturated calomel electrode;

(ii) about 5 to 30 percent, of the combined weight of components (i) and (ii), of an oxidant characterized by (a) reducibility by a semiconductor of (i), (b) the reduction being irreversible as demonstrated by cyclic voltammetry, and (c) the reduction generating a free-radical capable of initiating photopolymerization; and (iii) at least about 5 percent, of the combined weight of components (i) and (ii), of an organic reductant capable of donating an electron to the semiconductor of (i).

The photoinitiator systems of this invention are especially useful in water-soluble and dispersible systems. After exposure, development by solvent removal of unexposed material is readily achieved in water or semiaqueous solution.

Preferred semiconductors are inorganic pigments such as titanium dioxide, zinc oxide, tungstic anhydride ($WO_3$), tin dioxide, strontium titanate ($SrTiO_3$), cadmium sulfide, zinc sulfide, barium titanate ($BaTiO_3$), cadmium oxide, potassium metatantalate ($KTaO_3$), and gallium phosphide (GaP). Titanium dioxide ($TiO_2$) is particularly preferred. $TiO_2$ preferably has a surface area of more than about 100 $m^2/g$.

Preferred oxidants are the nitrobenzyl halides, i.e., chlorides, bromides, and iodides: p-nitrobenzyl chloride, p-nitrobenzyl bromide, p-nitrobenzyl iodide, o-nitrobenzyl chloride, o-nitrobenzyl bromide, o-nitrobenzyl iodide, m-nitrobenzyl chloride, m-nitrobenzyl bromide and m-nitrobenzyl iodide. Most preferred are the p-nitrobenzyl halides with p-nitrobenzyl bromide being particularly preferred.

The remaining essential ingredient of the photoinitiator is the organic reductant. Suitable reductants will have an oxidation potential relative to the saturated calomel electrode at least about 0.1 volt more negative than the valence band potential of the semiconductor with which it is to be used. Oxidation of the reductant is preferably an irreversible process, i.e., showing irreversibility of cyclic voltamogram during repeated anodic $\rightleftarrows$ cathodic cycles. Preferred reductants include poly(vinyl alcohol), sodium carboxymethyl cellulose, triethanolamine, p-toluenesulfinate anion, acrylate anion, and the like. Preferred levels of reductant are about 5 to 25 percent and most preferably about 5 to 20 percent of the combined weight of components (i) and (ii).

Amounts of photoinitiator components are most readily appreciated in terms of the total weight of semiconductor and oxidant with the reductant being at least about 5 percent of the total of semiconductor and oxidant. When the amounts of photoinitiator components are placed in terms of total combined semiconductor, oxidant and reductant, the parameters will vary between about: (i) 3% to 93% of semiconductor, (ii) 2% to 40% of oxidant, and (iii) 5% to 95% of reductant. On the basis of total combined weight of photoinitiator components, preferred compositions comprise about: (i) 50% to 90% of semiconductor, (ii) 5% to 25% of oxidant, and (iii) 5% to 25% of reductant.

The amount of photoinitiator used for photopolymerization or photocross-linking will vary depending on the amount and type of ethylenically unsaturated photomonomer and the specific application of the system. Preferably, the photoinitiator will be present in the amount of about 2 to 55 percent, and most preferably about 5 to 30 percent based on total weight of photosensitive composition.

DETAILS OF THE INVENTION

Concerning The Semiconductor (i)

Energy gaps of a number of common inorganic semiconductor pigments are listed in "American Institute of Physics Handbook", Third Edition, McGraw Hill Book Co., 1972, pages 9–60 and 9–61; by Kittel in "Introduction to Solid State Physics", Fourth Edition, John Wiley & Sons, Inc., New York, 1971, page 364; and by Huggins et al, "Annual Review of Materials Science", Vol. 8, 1978, Table 1, pages 111 to 114.

Measurement of conduction band potentials of semiconductor pigments under flat band conditions is discussed by Kohl and Bard, J. Amer. Chem. Soc., 99, pages 7531–7539 (1977), and by Huggins et al, Annual Review of Materials Science, Vol. 8, 1978, pages 115 to 119, and includes the following methods: (1) use of the Schottky-Mott equation; (2) measurement of photoinduced potential change ("open circuit photovoltage"), a technique described further by Myamlin and Pleskov in "Electrochemistry of Semiconductors", Plenum Press, New York, 1967, pages 113 to 114; (3) measurement of the applied potential required for observation of the onset of a photocurrent at the irradiated semiconductor, see also Kung et al, J. Appl. Phys., 48, pages 2463–2469 (1977).

Average valence band potentials ($E_{vb}$) of semiconductor pigments are conveniently calculated from energy gap ($E_G$) and the conduction band potential ($E_{cb}$) of the pigment in accordance with the equation:

Valence Band Potential=Energy Gap (Minus) the absolute value of Conduction Band Potential, i.e., $$E_{vb}=E_G-|E_{cb}|.$$

Table A below lists valence band potentials for several semiconductor pigments which can be employed in the initiators of this invention.

TABLE A

| Semiconductor Pigment | $E_{vb}$ (volts) |
|---|---|
| $TiO_2$ | 2.4 |
| ZnO | 1.85 |
| $WO_3$ | 1.90 |
| CdS | 1.5 |

Concerning The Oxidant (ii)

Application of the three criteria described in the Summary Of The Invention to selection of oxidants has led to the determination that the nitrobenzyl halides are the preferred oxidants. Other operable oxidants can be selected by those skilled in the art in light of the recited criteria.

Concerning The Reductant (iii)

Oxidation potentials of a number of organic compounds are listed by Mann and Barnes in "Electrochemical Reactions in Non-Aqueous Systems", Marcel Dekker, Inc., New York, 1970, and they can be obtained readily by direct measurement. The oxidation potential requirement of the organic reductant stipulates families of reductants which are appropriate for use with a particular semiconductor. Table B lists oxidation potentials for several common reductants. Since the cations associated with the reductant anions listed in Table B do not affect the reductant function of the anions, any cation is suitable which provides a soluble salt of the reductant anions.

TABLE B

| Reductant | Oxidation Potential (volts) |
|---|---|
| Poly(vinyl alcohol) | 2.3 |
| Acrylate anion | 1.7 |
| Triethanolamine | ~1.0 |
| p-Toluenesulfinate anion | ~0.8 |

Certain reductants, e.g., poly(vinyl alcohol) and sodium carboxymethyl cellulose, can function as binders as well as reductants in selected photopolymerizable compositions. When a material is employed which functions both as a reductant and a binder, an excess of such material can be employed over that required to satisfy its function as a reductant in order to provide additional material for its cofunction as a binder.

The Photomonomers

The initiator composition of this invention can be used for photopolymerization of ethylenically unsaturated monomers of all types, but preferably those that contain at least one terminal ethylenic group. Preferred monomers are those which are soluble or dispersible in aqueous solution. Especially preferred are combinations of at least one unsaturated monomer which contains one terminal ethylenic group and at least one unsaturated monomer which contains more than one terminal ethylenic group.

Classes of suitable ethylenically unsaturated monomers include unsaturated esters of alcohols, especially such esters of alpha-methylene carboxylic acids and substituted alpha-methylene carboxylic acids, more especially such esters of alkylene polyols and polyalkylene polyols, e.g, alkylene polyol di- and tri-acrylates and polyalkylene polyol di- and tri-acrylates prepared from alkylene polyols of 2 to 15 carbon atoms or polyalkylene ether polyols of 1 to 10 ether linkages; unsaturated amides, particularly those of alpha-methylene carboxylic acids; vinyl esters; unsaturated acids and salts thereof; vinylamides and vinylimides.

Examples of specific compounds which illustrate these classes are: ethylene glycol diacrylate, diethylene glycol diacrylate, glycerol diacrylate, glycerol triacrylate, hydroxyethyl acrylate, hydroxyethyl methacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, triethylene glycol diacrylate, triethylene glycol dimethacrylate, pentaerythritol diacrylate, pentaerythritol triacrylate, pentaerythritol tetramethacrylate, 1,3-propanediol diacrylate, 1,3-pentanediol dimethacrylate, p-$\alpha,\alpha$-dimethylbenzylphenyl acrylate, t-butyl acrylate, N,N-diethylaminoethyl acrylate, diethylaminoethyl methacrylate, 1,4-butanediol diacrylate, 1,6-hexanediol diacrylate, 1,10-decanediol diacrylate, 2,2-dimethylolpropane diacrylate, tripropylene glycol diacrylate, 2,2-di-(p-hydroxyphenyl)propane diacrylate, 2,2-di (p-hydroxyphenyl)propane dimethacrylate, polyoxyethyl 2,2-di-(p-hydroxyphenyl)propane dimethacrylate, polyoxypropyltrimethylolpropane triacrylate (molecular weight of 462), 1,4-butanediol dimethacrylate, 1,6-hexanediol dimethacrylate, 2,2,4-trimethyl-1,3-pentanediol dimethacrylate, 1-phenylethylene-1,2-dimethacrylate, trimethylolpropane trimethacrylate, ethylene glycol acrylate phthalate, polyoxyethyltrimethylolpropane triacrylate, the bis-acrylates and methacrylates of polyethylene glycols of molecular weight 200–500, and the like; acrylamide, methacrylamide, methylene bis-acrylamide, methylene bis-methacrylamide, ethylene bis-methacrylamide; divinyl succinate, vinyl acetate, divinyl adipate; acrylic acid, methacrylic acid, sodium acrylate, potassium methacrylate; vinyl-N-methylacetamide, vinyl ε-caprolactam; N-vinylpyrrolidone, and N-vinylsuccinimide.

The amount of ethylenically unsaturated monomer employed in a photopolymerizable or photocrosslinkable composition is usually about 20 to 85 percent by weight of the total composition.

The Photosensitive Composition

When the photoinitiators of this invention are employed in conventional photoimaging applications, it is preferred that the photosensitive composition include a polymeric binder in addition to the photoinitiator composition and monomer. Such binders are normally transparent to the radiation employed and are film-forming polymers compatible with other components of the system. Preferably, they are soluble or dispersible in aqueous solution.

Examples of suitable binders include poly(vinyl alcohol); carboxylated salts of cellulose, e.g., sodium carboxymethyl cellulose; hydrolyzed copolymers of maleic anhydride and styrene; poly(ethylene oxide); cellulose esters, e.g., cellulose acetate, and cellulose acetate succinate; cellulose ethers, e.g., methyl cellulose and ethyl cellulose; and poly(vinylpyrrolidone). The amount of binder employed is usually about 25 to 75 percent by weight of the photosensitive composition although greater amounts can be employed if desired.

The photosensitive composition can also contain optional components well-known in the art such as addition polymerization inhibitors, e.g., hydroquinone and alkyl and aryl-substituted hydroquinones; antioxidants and antiozonants; plasticizers, e.g., dialkyl phthalates; polymeric or nonpolymeric organic or inorganic fillers or reinforcing agents which are essentially transparent at the wavelengths used for exposure of the photosensitive composition and which do not scatter actinic radiation, e.g., the organophilic silicas, bentonites, and various types of dyes and pigments.

The photosensitive compositions can be prepared by mixing the components, preferably by solution or dispersion in a suitable solvent. Water is a preferred solvent. Photosensitive elements are usually prepared by applying the compositions to a suitable conventional substrate, i.e., a natural or synthetic support, preferably one which is capable of existing in a flexible or rigid film or sheet form. Conventional substrates, including paper, cardboard, wood, glass, metal, nylon, rubber, film-forming polymers, etc., are described in U.S. Pat. Nos. 2,760,863; 3,060,026; and 3,458,311. Application of the solution or dispersion to the substrate can be accomplished by any convenient means, e.g., it can be sprayed, brushed, applied by a roller or an immersion coater, flowed over the surface or picked up by immersion.

An additional component which can be added to the initiator composition is a radiation-sensitive dye. Suitable dyes include those that sensitize the photoconductivity of semiconductor pigments, particularly those that absorb visible wavelength radiation. Such dyes are discussed by Meier in "Spectral Sensitization", Focal Press Limited, London, 1968, pages 101 to 110. Examples of suitable dyes include Acriflavine CI 46000, Rose Bengal CI 45435, Acridine Orange CI 46005, Kryptocyanine, Fuchsine, Malachite Green, Erythrosine, Eosine, Fluorescein, Phthalocyanine, and merocyanine dyes.

The radiation-sensitive dyes, if used at all, are generally employed in amounts of about 0.5 to 5 percent by weight based on the total photosensitive composition.

Photopolymerization/Photoimaging

The initiator compositions of the invention are particularly valuable because of their applicability in aqueous processable photoimaging systems. Such systems avoid the use of organic solvents which are costly and present fire, health, and ecological hazards. The initiators can also be employed for the preparation of photoresists, printing plates and for other uses evident to those skilled in the art. U.S. Pat. Nos. 2,760,863, 3,060,023, 3,469,982, and 3,060,026 provide descriptions of several contemplated photoimaging techniques.

Photoimaging is preferably carried out in a vacuum, or it may be desirable to employ a top-coat or protective stratum for the element to be imaged. Such topcoats should be transparent to actinic radiation, substantially impermeable to oxygen and preferably permeable to water. One suitable coating, described in U.S. Pat. No. 3,458,311, is an adherent solid protective stratum characterized in that it has a weight of 2 to 30 mg per square decimeter and is homogeneous, non-strippable as an unsupported film and composed of a macromolecular organic polymer or polymer mixture that is soluble at 20° C. in water or in a mixture of water and a water-miscible organic solvent containing at least 50% by volume of water. Other coatings are described in British Pat. Nos. 1,148,362, and 1,303,578.

The photosensitive elements are exposed image-wise to actinic radiation, a portion of which contains wavelengths of about 2000 to 8000 Å and preferably about 2500 to 5000 Å. When radiation-sensitive dyes are employed, it is preferred to use wavelengths of about 2500 to 7500 Å. Suitable sources of such radiation include those conventionally employed such as ordinary sunlight, and artificial sources such as sunlamps, tungsten-halogen lamps, ultraviolet lamps providing radiation of short wavelength (2537 Å), and lamps providing radiation of longer wavelengths, narrow or broad band, such as fluorescent lamps, mercury, metal additive, and arc lamps. Xenon flash lamps, electron beam radiation, laser beams, and fluorescent radiation sources can also be used.

The radiation exposure times can vary from fractions of a second to minutes, depending upon the intensity and spectral energy distribution of the radiation used, its distance from the photosensitive layer, and the nature and amounts of the unsaturated compounds in the layer. Customarily, a distance of about 1.5 to 60 inches (3.8 to 153 cm) from the photosensitive layer is used.

Imagewise exposure is preferably through a process transparency, that is, an image-bearing transparency consisting of areas substantially opaque and other areas substantially transparent to the radiation being used. The opaque areas can be substantially of the same optical density, for example, in a so-called line or halftone negative or positive; or, there can be a graded range of opaque areas, for example, in a continuous tone negative. Process transparencies can be constructed of any suitable materials including cellulose acetate film and polyester film.

After exposure, the image is developed. Development can be by toning, i.e., dusting with a fine pigment which selectively adheres to the tacky unhardened areas, but generally the portions of the layer corresponding to the unexposed portions are removed. Removal is preferably by solvent washout, with water being a preferred solvent.

The following Examples will illustrate the invention, Examples 2, 3, 5 to 12, 24, 25 and 32 representing especially preferred embodiments. All parts and percentages are by weight and all degrees are Celsius unless otherwise stated.

The oriented polyester films employed as substrates were 4-mil (102 μm) films which were subcoated with a poly(vinylidene chloride) copolymer resin as described in U.S. Pat. No. 3,443,950.

EXAMPLE 1

The titanium dioxide semiconductor powder was prepared as follows. A caustic soda solution, at a concentration of 260 g per liter of NaOH, was mixed in a corrosion-resistant reaction vessel with a titanium chloride solution, containing 60 g per liter of $TiO_2$ and about 98 g per liter of active HCl, until an alkaline $TiO_2$ suspension, at a normality of about 0.8 of NaOH was obtained. Sufficient hydrochloric acid, at a 25% strength, was then incorporated in said alkaline suspension to convert the same to an acidic suspension with a normality of about 0.5 HCl. This acid $TiO_2$ suspension was then heated to about 85° C. and is held at that temperature for about 25 minutes to effect a final curing of the $TiO_2$ and peptization to a colloidal sol. A 5% quantity, based on the $TiO_2$ present, of said sol was used in the hydrolysis (through boiling for 3 hours) of a titanium sulfate solution obtained from the sulfuric acid dissolution of ilmenite and containing about 250 g of $TiO_2$ per liter, with an F.A. value of 70, resulting in a yield in excess of 95% anatase titanium oxide. This hydrolysate, after being filtered, was purified by neutralizing excess acid with ammonia to a final pH of 8 to 9. The powder was washed with water and air-dried.

A stock solution was prepared by dissolving 20.0 g of low molecular weight poly(vinyl alcohol), $M_n$ about 10,000, which contained 12 mole percent of acetate groups, in 167 g of distilled water containing 0.80 g of a nonionic poly(ethylene oxide) wetting agent, and then adding 3.60 g of triethylene glycol diacrylate and 8.40 g of hydroxyethyl acrylate.

To 20.0 g of the stock solution were added 0.50 g of titanium dioxide powder, 0.10 g of p-nitrobenzyl bromide and 0.10 g of potassium p-toluenesulfinate. The mixture was magnetically stirred in a red (low actinic glass) flask for 2 hours to produce a dispersion. The dispersion was cast as a thin film on an oriented polyester film substrate at a wet thickness of 3 mils (76 μm), and the coated substrate was dried in the dark to give a uniform white film. The dried film was exposed through an oriented polyester film process transparency in a vacuum frame to the output of a 275 watt sunlamp at a distance of 12 inches (30.5 cm) for two minutes. Development of the exposed film with a water spray removed material in the unexposed region to produce a pigmented, polymeric relief image.

EXAMPLES 2 AND 3 AND COMPARISONS A TO C

Twenty grams of the stock solution of Example 1 was placed in each of five red flasks. Comparative Compositions A to C served as controls for the compositions of Examples 2 and 3. Other ingredients, in grams, were added as shown in Table 1. The compositions were mixed for 2 hours, cast as thin films at a wet thickness of 5 mils (127 μm) on oriented polyester film substrates, and the coated films were dried in the dark. The dried films were exposed and developed as in Example 1. Films cast from comparison compositions A, B and C gave no images on development whereas films cast from the compositions of Examples 2 and 3 held pigmented relief images.

When samples of films of Examples 2 and 3 were exposed as in Example 1 except that the process transparency was replaced with a 30-step $\sqrt[3]{2}$ stepwedge process transparency, the film of Example 2 held 3 steps of photopolymer and that of Example 3 held 9 steps.

The transparency is graded from transparent to opaque.

TABLE 1

| Ingredient | Comparison A | Comparison B | Comparison C | Example 2 | Example 3 |
|---|---|---|---|---|---|
| Stock solution containing poly(vinyl alcohol) reductant | 20.0 | 20.0 | 20.0 | 20.0 | 20.0 |
| $TiO_2$ (of Ex. 1) | 0 | 0.75 | 0.75 | 0.75 | 0.75 |
| Potassium p-toluenesulfinate | 0.10 | 0 | 0.10 | 0 | 0.10 |
| p-Nitrobenzyl bromide | 0.10 | 0 | 0 | 0.10 | 0.10 |

This comparison shows that a combination of a semiconductor, an oxidant, and a reductant (poly(vinyl alcohol)) is needed for effective photoinitiator systems. Increased photospeeds are obtained upon addition of a preferred reducing agent (potassium p-toluenesulfinate).

EXAMPLE 4 AND COMPARISONS D TO G

This Example illustrates the use of zinc oxide as a semiconductor pigment in a composition of the invention. This Example and these Comparisons also show that photoinitiation will be ineffectual unless the reducing agent is carefully selected to complement the particular semiconductor employed. See, in that regard, Comparative Example G and Tables A and B.

Five red flasks were charged as shown in Table 2. The mixtures were stirred, and films were cast as described with regard to Examples 2 and 3. Exposure and development for 2 minutes as described in Example 1 produced an image only in the case of the composition of Example 4. The image could be removed by further vigorous development. Additional films prepared from each flask were exposed for 10 minutes, and the exposed films were developed with water. Films of compositions E and F gave no images, and films of compositions D and G gave weak images which were removed on development. Only the film of the composition of Example 4 gave a durable relief image after development. Hence poly(vinyl alcohol) is not effective as a reductant for use with zinc oxide.

TABLE 2

| Ingredient | Comparison D | Comparison E | Comparison F | Comparison G | Example 4 |
|---|---|---|---|---|---|
| Stock solution (of Example 1) containing poly-(vinyl alcohol) reductant | 20.0 | 20.0 | 20.0 | 20.0 | 20.0 |
| Zinc oxide | 0.75 | 0.75 | — | 0.75 | 0.75 |
| Potassium p-toluene sulfinate | 0.10 | — | — | — | 0.10 |
| p-Nitrobenzyl bromide | — | — | 0.10 | 0.10 | 0.10 |

EXAMPLES 5 TO 12

A stock solution was prepared by dissolving 10.00 g of sodium carboxymethyl cellulose (reductant) in 150 g of water which contained 1.00 g of a nonionic poly-(ethylene oxide) wetting agent followed by the addition of 7.00 g of triethylene glycol diacrylate and 17.00 g of hydroxyethyl methacrylate.

Twenty grams of the stock solution was placed in each of eight red flasks and other ingredients, in grams, were added as shown in Table 3.

TABLE 3

| Ingredient | Example | | | | | | | |
|---|---|---|---|---|---|---|---|---|
| | 5 | 6 | 7 | 8 | 9 | 10 | 11 | 12 |
| Stock solution containing carboxymethyl cellulose reductant | 20.0 | 20.0 | 20.0 | 20.0 | 20.0 | 20.0 | 20.0 | 20.0 |
| TiO$_2$ (of Ex. 1) | 0.75 | — | — | — | 0.75 | — | — | — |
| p-Nitrobenzyl bromide | 0.10 | 0.10 | 0.10 | 0.10 | 0.10 | 0.10 | 0.10 | 0.10 |
| Cadmium sulfide[1] | — | 0.75 | — | — | — | 0.75 | — | — |
| Cadmium sulfide[2] | — | — | 0.75 | — | — | — | 0.75 | — |
| Tungstic anhydride (WO$_3$) | — | — | — | 0.75 | — | — | — | 0.75 |
| Triethanolamine | — | — | — | — | 0.10 | 0.10 | 0.10 | 0.10 |

[1]Reagent-grade cadmium sulfide powder
[2]Semiconductor-grade cadmium sulfide powder The mixtures were stirred and films were cast on oriented polyester film substrates as described in Examples 2 and 3. Dried films were exposed through the substrate in air through a 30-step $\sqrt[3]{2}$ stepwedge process transparency to the output of two 15-watt black-light fluorescent lamps at a distance of two inches (5.08 cm) (1.25 mwatt/cm$^2$) for two minutes. Development of the exposed films with a 1% calcium acetate aqueous solution gave the results tabulated in Table 4.

TABLE 4

| Example No. | FILMS | | | | | | | |
|---|---|---|---|---|---|---|---|---|
| | 5 | 6 | 7 | 8 | 9 | 10 | 11 | 12 |
| No. of Polymer Steps Held | 5 | 1 | 2 | 3 | 13 | 17 | 7 | 14 |

EXAMPLES 13 TO 15

A stock solution was prepared by dissolving 20.0 g of low molecular weight poly(vinyl alcohol), M$_n$ about 10,000, which contained 12 mole percent of acetate groups in 167 g of distilled water containing 0.80 g of a nonionic poly(ethylene oxide) wetting agent, and then adding 3.60 g of triethylene glycol diacrylate and 8.40 g of hydroxyethyl methacrylate.

To each of three 20.0 g portions of the stock solution in red flasks were added 0.75 g of the titanium dioxide powder of Example 1 and the quantity, in grams, of p-nitrobenzyl bromide shown in Table 5. The mixtures were prepared and films were cast on oriented polyester substrates as described in Examples 2 and 3. Dried films were exposed under vaccum through the stepwedge process transparency and developed as described in Examples 2 and 3 and the results are tabulated in Table 5.

TABLE 5

| Film of Example | p-Nitrobenzyl Bromide | | Number of Polymer Steps Held |
|---|---|---|---|
| | p-Nitrobenzyl Bromide (wt) | Percent of Photosensitive Composition | |
| 13 | 0.05 | 1.2 | 9/10 |
| 14 | 0.10 | 2.4 | 10 |
| 15 | 0.20 | 4.8 | 13 |

EXAMPLES 16 TO 18

To each of three 20.0 g portions of a stock solution, prepared as described with regard to Examples 13 to 15, in red flasks, were added 0.75 g of titanium dioxide powder of Example 1 and 0.10 g of one of the oxidants shown in Table 6. The mixtures were prepared, and films were cast as described in Examples 2 and 3. Dried films were exposed under vacuum through the stepwedge process transparency and developed as described in Examples 2 and 3. Results are tabulated in Table 6.

TABLE 6

| Film of Example | Oxidant Added | Number of Polymer Steps Held |
|---|---|---|
| 16 | p-Nitrobenzyl Bromide | 16 |
| 17 | p-Nitrobenzyl Chloride | 15 |
| 18 | p-Nitrobenzyl Iodide | 8 |

EXAMPLES 19 TO 24

A stock solution containing 10.00 g of sodium carboxymethyl cellulose, 1.00 g of poly(vinyl alcohol), 1.00 g of a nonionic poly(ethylene oxide) wetting agent, 17.00 g of hydroxyethyl methacrylate and 7.00 g of triethylene glycol diacrylate in 150 g of water was prepared. Each of three red flasks was charged with 20.0 g of the stock solution, 0.75 g of titanium dioxide powder of Example 1, 0.10 g of triethanolamine, and 0.10 g of one of the components shown in Table 7. The mixtures were prepared, and films were cast, exposed, polymerized, and developed as described with regard to Examples 5 to 12. Results are reported in Table 7. A similar film containing m-nitrobenzyl bromide held no polymer steps when exposed in the same manner.

TABLE 7

| Film of Example | Oxidant Added | Number of Polymer Steps Held |
|---|---|---|
| 19 | p-Nitrobenzyl Bromide | 11 |
| 20 | o-Nitrobenzyl Bromide | ~2 |

Additional samples of cast films of Examples 19 and 20 were exposed through an oriented polyester film process transparency. Also exposed through an oriented polyester film process transparency was a film prepared and treated in the same way as the films of Examples 19 and 20 except that the oxidant was m-nitrobenzyl bromide. Results are reported in Table 7A.

TABLE 7A

| Example | Film of Example | Oxidant Added | Image Description |
|---|---|---|---|
| 21 | 19 | p-nitrobenzyl bromide | excellent reproductive image |
| 22 | 20 | o-nitrobenzyl bromide | acceptable reproductive |

TABLE 7A-continued

| Example | Film of Example | Oxidant Added | Image Description |
|---|---|---|---|
| 23 | — | m-nitrobenzyl bromide | image perceptible but weak image |

EXAMPLES 24 AND 25

These Examples demonstrate the superiority of sodium acrylate compared with acrylic acid as an organic reductant.

A stock solution (A) containing 20.00 g of poly(vinyl alcohol) which contained 12 mole percent of acetate groups, 0.80 g of a nonionic poly(ethylene oxide) wetting agent, 3.60 g of triethylene glycol diacrylate, 8.40 g of acrylic acid and 167 g of water was prepared. The solution had a final pH of 3. A second stock solution (B) was prepared by treating a portion of solution A with sufficient sodium hydroxide to neutralize all the carboxyl groups present to give a solution with a final pH of 7.

Twenty grams of each stock solution, A and B, was mixed with 0.75 g of titanium dioxide powder of Example 1 and 0.10 g of p-nitrobenzyl bromide in red flasks to give the compositions of Examples 24 and 25 respectively. Films were cast from each composition as described in Examples 2 and 3. Films dried for 3 days were exposed under vacuum through the stepwedge process transparency and developed as described in Examples 2 and 3. The film prepared from the composition of Example 24 held 13/14 polymer steps, and the film prepared from the composition of Example 25 held 17/18 polymer steps.

EXAMPLES 26 TO 29 AND COMPARISONS H AND I

These Examples demonstrate that radiation-sensitive dyes can sensitize the photoinitiator system to visible wavelengths absorbed by the dyes but not by the photoinitiator system.

To each of four 20.0 g portions of a stock solution, prepared as described with regard to Examples 13 to 15, in red flasks, was added 0.75 g of titanium dioxide powder (of Example 1), 0.1 g of p-nitrobenzyl bromide, and the components, in grams, shown in Table 8. An additional flask of Comparison Composition H (control) was prepared which contained 20.0 g of the stock solution and 0.1 g of p-nitrobenzyl bromide but no titanium dioxide. An additional flask of Comparison Composition I (control) was prepared which contained 20.0 g of the stock solution but no p-nitrobenzyl bromide and no titanium dioxide. Films were cast, exposed under vacuum through the stepwedge process transparency, and developed as described in Examples 2 and 3. Results are summarized in Table 8.

TABLE 8

| Film of Example or Comparison | Added Components | | Number of Polymer Steps Held |
|---|---|---|---|
| | Potassium p-Toluene-sulfinate | Acriflavine dye CI 46000 | |
| 26 | — | — | 3 |
| 27 | 0.1 | — | 8/9 |
| 28 | 0.1 | 0.05 | 9 |
| 29 | — | 0.05 | 14 |
| H | — | 0.05 | 0 |
| I | 0.1 | 0.05 | 0[1] |

[1] Some dye bleaching was observed.

EXAMPLES 30 AND 31

To each of two 20.0 g portions of a stock solution, prepared as described with regard to Examples 13 to 15, in red flasks, were added 0.75 g of titanium dioxide powder of Example 1 and 0.10 g of p-nitrobenzyl bromide. To one flask (Example 30) was added 0.10 g of Acriflavine dye and to the second flask (Example 31) was added 0.10 g of Rose Bengal dye, CI 45435. Films were cast, exposed under vacuum through the stepwedge process transparency, and developed as described in Examples 2 and 3. The film of Example 30 held 8 polymer steps and the film of Example 31 held 9 polymer steps.

EXAMPLE 32

A mixture was prepared as described for Example 30 except that the Acriflavine dye was replaced with 0.05 g of Acridine Orange dye, CI 46005. A film cast, exposed and developed as described in Examples 2 and 3 held 16 polymer steps.

EXAMPLES 33 TO 35

Imaging Energies

Absolute imaging energies were determined for the compositions of Examples 26, 29, and 32. The results are summarized in Table 9. The energies are the minimum required for image retention.

The apparatus consisted of a 2.5 Kwatt Hg-Xe Hanovia arc lamp operated at 50 amps and 45 volts. The lamp output was passed through neutral density screens and, via appropriate optics, a Bausch & Lomb 0.5 meter monochromator blazed at 300 nm, with a first order dispersion of 16.5 Å/mm. The monochromatic output was optically restricted to a 1 cm$^2$ spot. Light intensity was determined with a calibrated YSI Model 65 radiometer. Films were automatically exposed (the results were the same in air and vacuum) to light of known wavelength and intensity for known times by use of a synchronous carriage motor and a shutter which was time programmed. Exposed films were developed and the exposure time required to produce a developed image was determined by inspection. Imaging energies (mjoules/cm$^2$) were calculated from the incident light intensity (mwatt/cm$^2$) multiplied by the required minimum exposure time (sec). The results demonstrate that dyes are capable of sensitizing a photoinitiator to wavelengths absorbed by the dye but not by the semiconductor.

TABLE 9

| Ex. No. | Composition of Example | λ (nm) | Energy (mj/cm$^2$) |
|---|---|---|---|
| 33 | 26 | 366 | 20 |
| | | 440 | >500 |
| 34 | 29 | 366 | 20 |
| | | 440 | 55 |
| 35 | 32 | 366 | 22 |
| | | 448 | 72 |

The embodiments of the invention in which an exclusive property or privilege is claimed are defined as follows:

1. A photoinitiator for polymerizing ethylenically unsaturated monomers comprising, based on total weight of the photoinitiator:
   (i) about 70 to 95 percent, of the combined total of components (i) and (ii), of a wide-band n-type inorganic pigment semiconductor characterized by (a) an energy gap greater than about 2.0 electron volts, and (b) a conduction band potential under flat band conditions more negative than zero volts versus the saturated calomel electrode;
   (ii) about 5 to 30 percent, of the combined total of components (i) and (ii), of an oxidant characterized by (a) reducibility by the semiconductor (i), (b) the reduction being irreversible as demonstrated by cyclic voltammetry, and (c) the reduction generating a free-radical capable of initiating photopolymerization; and
   (iii) at least about 5 percent, of the combined total of components (i) and (ii), of an organic reductant capable of donating an electron to the semiconductor if (i), and having an oxidation potential relative to the saturated calomel electrode at least about 0.1 volt more negative than the valence band potential of (i).

2. A photoinitiator according to claim 1 wherein the oxidant is nitrobenzyl halide.

3. A photoinitiator according to claim 2 wherein the semiconductor is selected from at least one member of the group consisting of titanium dioxide, zinc oxide, tungstic anhydride, tin dioxide, strontium titanate, cadmium sulfide, zinc sulfide, barium titanate, cadmium oxide, potassium metatantalate, and gallium phosphide.

4. A photoinitiator according to claim 2 wherein the reductant is selected from at least one member of the group consisting of poly(vinyl alcohol), sodium carboxymethyl cellulose, triethanolamine, p-toluenesulfinate anion, and acrylate anion.

5. A photoinitiator according to claim 2 wherein the oxidant is selected from at least one member of the group consisting of o-nitrobenzyl chloride, o-nitrobenzyl bromide, o-nitrobenzyl iodide, m-nitrobenzyl chloride, m-nitrobenzyl bromide, m-nitrobenzyl iodide, p-nitrobenzyl chloride, p-nitrobenzyl bromide, and p-nitrobenzyl iodide.

6. A photoinitiator according to claim 5 wherein the semiconductor is $TiO_2$, the oxidant is p-nitrobenzyl halide, and the reductant is selected from at least one of p-toluenesulfinate anion and triethanolamine.

* * * * *